(12) United States Patent
Kim et al.

(10) Patent No.: US 9,343,483 B2
(45) Date of Patent: May 17, 2016

(54) METHOD FOR MANUFACTURING THIN FILM TRANSISTOR ARRAY SUBSTRATE

(71) Applicant: LG Display Co., Ltd., Seoul (KR)

(72) Inventors: Min-Cheol Kim, Gyeonggi-do (KR); Youn-Gyoung Chang, Gyeonggi-do (KR); Kwon-Shik Park, Seoul (KR); So-Hyung Lee, Gyeonggi-do (KR); Ho-Young Jung, Gyeonggi-do (KR); Ha-Jin Yoo, Gyeonggi-do (KR); Jeong-Suk Yang, Chungcheongnam-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/582,274

(22) Filed: Dec. 24, 2014

(65) Prior Publication Data

US 2015/0187809 A1 Jul. 2, 2015

(30) Foreign Application Priority Data

Dec. 27, 2013 (KR) .......................... 10-2013-0165678

(51) Int. Cl.
*H01L 27/12* (2006.01)

(52) U.S. Cl.
CPC .......... *H01L 27/124* (2013.01); *H01L 27/1225* (2013.01); *H01L 27/1248* (2013.01); *H01L 27/1288* (2013.01)

(58) Field of Classification Search
CPC .................... H01L 29/78681; H01L 29/66742
USPC ................................................... 438/104, 158
See application file for complete search history.

(56) References Cited

U.S. PATENT DOCUMENTS

| | | | |
|---|---|---|---|
| 2008/0110858 A1* | 5/2008 | Itoh et al. .......................... | 216/41 |
| 2009/0121234 A1* | 5/2009 | Jeon et al. ........................ | 257/72 |
| 2013/0207111 A1* | 8/2013 | Yamazaki ........................ | 257/57 |

* cited by examiner

*Primary Examiner* — Cuong Q Nguyen
*Assistant Examiner* — Tong-Ho Kim
(74) *Attorney, Agent, or Firm* — Morgan, Lewis & Bockius LLP

(57) ABSTRACT

A method for manufacturing a thin film transistor (TFT) array substrate having enhanced reliability is disclosed. The method includes forming a multilayer structure including at least one first metal layer and a second metal layer made of copper, forming a first mask layer including a first mask area corresponding to a data line and a second mask area corresponding to an electrode pattern to overlap with an active layer, patterning the multilayer structure, thereby forming the data line constituted by the multilayer structure, patterning the second metal layer, thereby forming the electrode pattern constituted by the at least one first metal layer, forming a second mask layer to expose a portion of the electrode pattern corresponding to a channel area of the active layer, patterning the at least one first metal layer, thereby forming source and drain.

6 Claims, 11 Drawing Sheets

METHOD FOR MANUFACTURING THIN FILM TRANSISTOR ARRAY SUBSTRATE

This application claims the benefit of Korean Patent Application No. 10-2013-0165678, filed on Dec. 27, 2013, which is hereby incorporated by reference as if fully set forth herein.

BACKGROUND OF THE INVENTION

1. Field of the Invention

The present invention relates to a thin film transistor (TFT) array substrate included in a display device driven in an active matrix driving mode, and more particularly to a method for manufacturing a TFT array substrate having enhanced reliability.

2. Discussion of the Related Art

With the recent development of information-dependent society, the field of displays to visually express electrical information signals has rapidly developed. As a result, research to develop various flat display devices having superior thinness, lightness, and low power consumption is being conducted.

Representative examples of such flat display devices include a liquid crystal display (LCD), a plasma display panel (PDP), a field emission display (FED), an electro luminescent display (ELD), an electro-wetting display (EWD), an organic light emitting display (OLED), and the like.

These flat display devices commonly include, as an essential constituent element thereof, a flat display panel to realize an image. The flat display panel has a structure in which two substrates are assembled to face each other under the condition that an inherent luminous material or polarizing material is interposed between the substrates.

In the case of a display device driven in an active matrix driving mode, in which a plurality of pixels is individually driven, one of the two substrates thereof is a thin film transistor (TFT) array substrate.

The TFT array substrate includes gate lines and data lines, which extend to intersect with each other in order to define a plurality of pixel areas, and a plurality of TFTs formed at respective intersections of the gate lines and data lines, to correspond to respective pixel areas.

Each TFT includes a gate electrode, an active layer overlapping with at least a portion of the gate electrode, and source and drain electrodes respectively contacting opposite sides of the active layer.

Meanwhile, each data line is formed to have a multilayer structure including a metal layer made of copper (Cu) in order to reduce resistance of the data line.

In connection with this, the source and drain electrodes are also formed in the form of a multilayer structure including a metal layer made of copper (Cu) because the source and drain electrodes are formed simultaneously with the data lines in order to reduce the number of mask processes to be performed.

FIG. 1 is a process view showing a process for forming source and drain electrodes in a method for manufacturing a general TFT array substrate.

As shown in FIG. 1, a gate electrode GE is formed on a substrate 11. A gate insulating film 12 is then formed over the substrate 11, to cover the gate electrode GE. Thereafter, an active layer ACT is formed on the gate insulating film 12, to overlap with the gate electrode GE. First and second metal layers L1 and L2 are then formed over the gate insulating film 12, to cover the active layer ACT. In this case, one of the first and second metal layers L1 and L2 (for example, the second metal layer L2) is made of copper (Cu).

Subsequently, the first and second metal layers L1 and L2 are patterned under the condition that a mask layer 15 including an opening corresponding to a channel area CA of the active layer ACT has been formed on the second metal layer L2, to form source and drain electrodes SE and DE respectively constituted by the first and second metal layers L1 and L2.

During patterning of the first and second metal layers L1 and L2, the channel area CA of the active layer ACT is exposed. As a result, copper (Cu) ions of the second metal layer L2 (indicated by solid arrows in FIG. 1) may be easily introduced into the exposed channel area CA of the active layer ACT.

That is, the copper (Cu) ions of the second metal layer L2 are absorbed or diffused into the channel area CA of the active layer ACT, thereby causing the band gap of the active layer ACT to be incorrect. As a result, characteristics of the TFT are degraded and, as such, reliability of the TFT array substrate is degraded.

SUMMARY OF THE INVENTION

Accordingly, the present invention is directed to a method for manufacturing a thin film transistor array substrate that substantially obviates one or more problems due to limitations and disadvantages of the related art.

An object of the present invention is to provide a method for manufacturing a thin film transistor (TFT) array substrate, which is capable of preventing copper (Cu) ions from being introduced into an active layer while forming data lines to have a multilayer structure containing copper (Cu) in order to exhibit reduced resistance, thereby enhancing reliability of TFTs and reliability of a TFT array substrate.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for manufacturing a thin film transistor array substrate including gate and data lines intersecting with each other to define a plurality of pixel areas comprises forming, on the substrate, the gate lines and gate electrodes respectively branched from corresponding ones of the gate lines, to correspond to the pixel areas, forming, over the substrate, a gate insulating film to cover the gate lines and the gate electrodes, forming, on the gate insulating film, active layers to overlap with the gate electrodes, respectively, forming, over the gate insulating film, a multilayer structure including at least one first metal layer and a second metal layer made of copper (Cu), forming, on the multilayer structure, a first mask layer including first mask areas respectively corresponding to the data lines while having a first height, and second mask areas corresponding to electrode patterns to overlap with the active layers, respectively, while having a second height lower than the first height, patterning the multilayer structure under condition that the first mask layer has been formed, thereby forming the data lines constituted by the multilayer structure, removing the second areas of the first mask layer, and asking the first mask layer such that the first mask areas have a third height lower than the first height, patterning the second metal layer under condition that the first mask areas having the third height have been formed, thereby forming the electrode patterns constituted by the at least one first metal layer, removing the first mask areas having the third height, and forming, on the gate insulating film, a second mask layer to expose portions of the electrode patterns respectively corresponding to channel areas of the active layers, and patterning the at least one first metal layer under condition that the second mask layer has been formed, thereby forming source and drain electrodes constituted by the at least one first metal layer and spaced from each other at opposite sides of each channel area of corresponding ones of the active layers.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and along with the description serve to explain the principle of the invention. In the drawings.

DETAILED DESCRIPTION OF THE ILLUSTRATED EMBODIMENTS

Reference will now be made in detail to the preferred embodiments of the present invention associated with a method for manufacturing a thin film transistor (TFT) array substrate, examples of which are illustrated in the accompanying drawings.

Hereinafter, a TFT array substrate according to an embodiment of the present invention will be described with reference to FIGS. 2 to 4.

Figure 1:
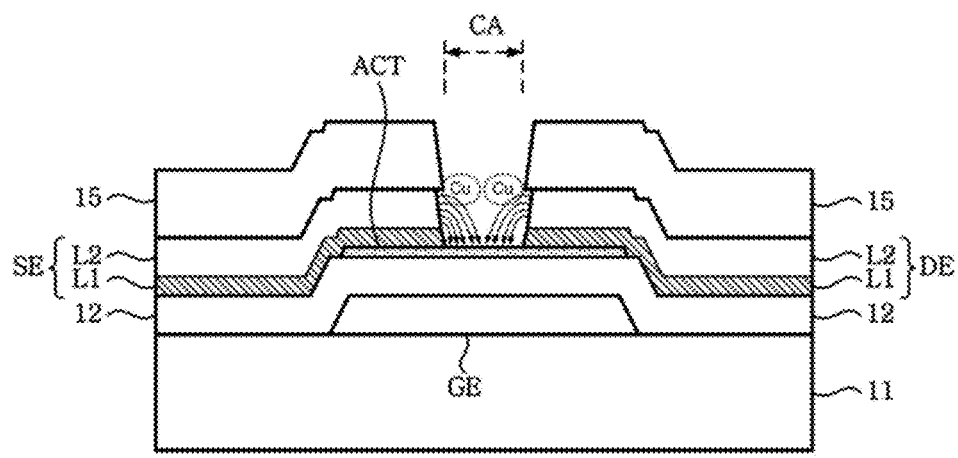
FIG. 1 is a process view showing a process for forming source and drain electrodes in a method for manufacturing a general thin film transistor (TFT) array substrate.
Figure 2:
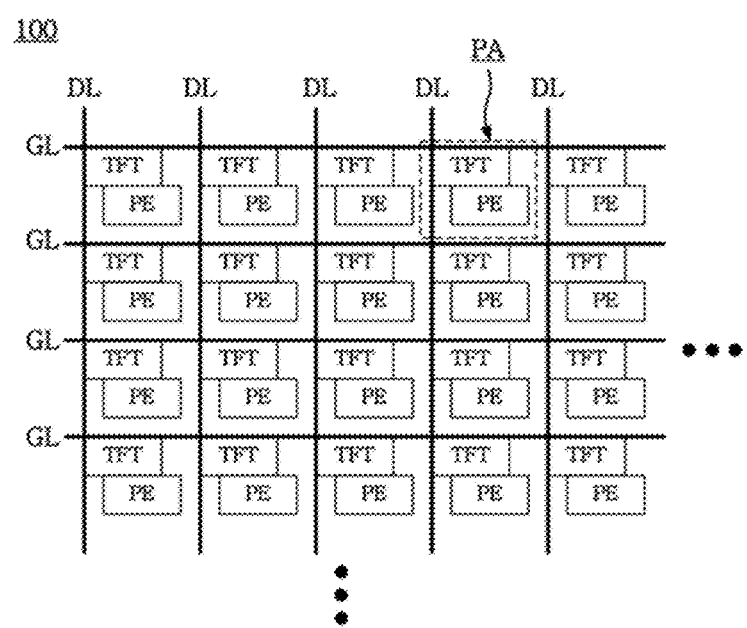
FIG. 2 is a schematic view illustrating a TFT array substrate according to an example embodiment of the present invention.

FIG. 2 is a schematic view illustrating the TFT array substrate according to the example illustrated embodiment of the present invention. FIG. 3 is a plan view illustrating a portion of one pixel area illustrated in FIG. 2. FIG. 4 is a cross-sectional view taken along a line I-I' in FIG. 3.

As illustrated in FIG. 2, the TFT array substrate according to the illustrated embodiment of the present invention, which is designated by reference numeral "100", includes gate lines GL and data lines DL, which extend to intersect with each other in order to define a plurality of pixel areas PA, and a plurality of thin film transistors TFT formed at respective intersections of the gate lines GL and data lines DL, to correspond to respective pixel areas PA. The TFT array substrate also includes pixel electrodes PE corresponding to respective pixel areas PA while being connected to respective thin film transistors TFT.

Figure 3:
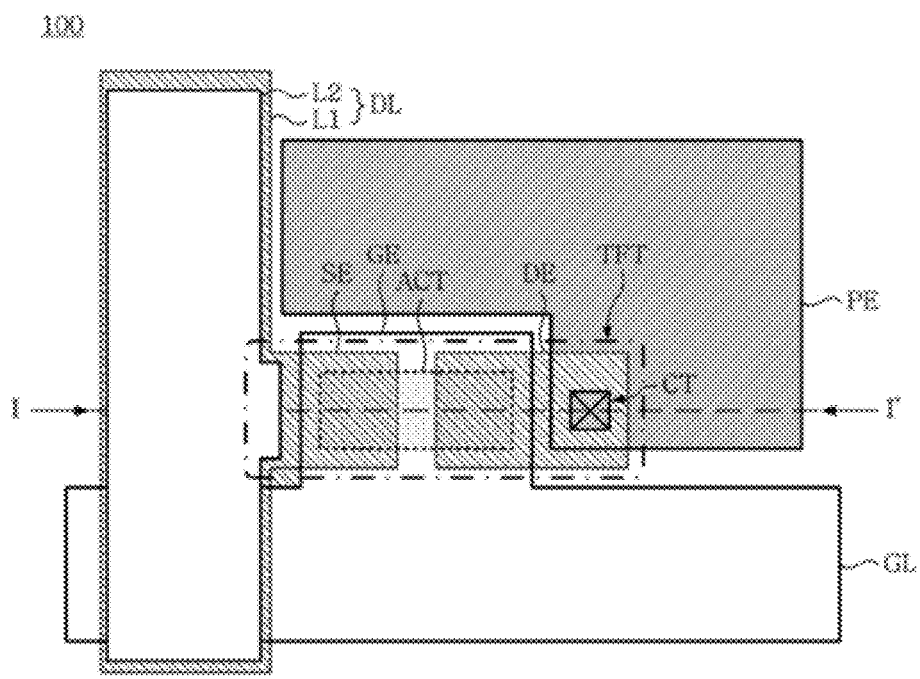
FIG. 3 is a plan view illustrating a portion of one pixel area illustrated in FIG. 2.

As illustrated in FIG. 3, each data line DL is formed to have a multilayer structure including at least one first metal layer L1 and a second metal layer L2. The second metal layer L2 is made of copper (Cu).

In this case, the first metal layer L1 is made of one of molybdenum-titanium (MoTi), molybdenum (Mo), titanium (Ti), and chromium (Cr).

Each thin film transistor TFT includes a gate electrode GE branched from the corresponding gate line GL, an active layer ACT overlapping with at least a portion of the gate electrode GE, a source electrode SE branched from the corresponding data line DL while contacting one side of the active layer ACT, and a drain electrode DE spaced from the source electrode SE while contacting the other side of the active layer ACT.

In this case, each of the source and drain electrodes SE and DE only includes at least one first metal layer L1 without including the second metal layer L2, differently than the data line DL.

The TFT array substrate 100 further includes a contact hole CT formed at an overlap area between the drain electrode DE and the pixel electrode PE. The pixel electrode PE is connected with the drain electrode DE via the contact hole CT.

Figure 4:
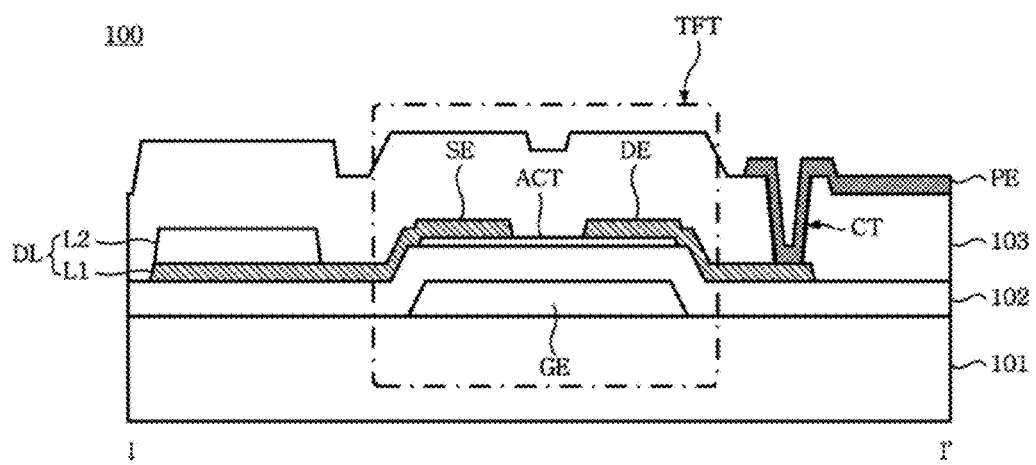
FIG. 4 is a cross-sectional view taken along a line I-I' in FIG. 3.

In addition, as illustrated in FIG. 4, the gate electrode GE of each thin film transistor TFT is formed on a substrate 101, and is covered by a gate insulating film 102 formed over the substrate 101.

Although not shown in detail in FIG. 4, the gate line GL is formed on the substrate 101, to extend in one direction, and is covered by the gate insulating film 102, similarly to the gate electrode GE.

The active layer ACT is formed on the gate insulating film 102 while being made of oxide semiconductor. The active layer ACT overlaps with at least a portion of the gate electrode GE.

In this case, the oxide semiconductor is $A_xB_yC_zO$ (x, y, z≥0). Here, A, B, and C are selected from Zn, Cd, Ga, In, Sn, Hf, Al, and Zr. For example, the oxide semiconductor may be one of In—Zn oxide (IZO), In—Ga—Zn oxide (IGZO), In—Sn—Zn oxide (ITZO), and In—Al—Zn oxide (IAZO).

The source and drain electrodes SE and DE are formed on the gate insulating film 102, using at least one first metal layer L1. In addition, the source and drain electrodes SE and DE are contact with the active layer ACT at opposite sides of the active layer ACT, respectively.

In addition, one of the source and drain electrodes SE and DE (for example, the source electrode SE) is branched from the first metal layer L1 of the data line DL, and is connected to the data line DL.

The thin film transistor TFT and data line DL as described above are covered by an interlayer insulating film 103 formed over the gate insulating film 102.

The contact hole CT is formed to extend through the insulating film 103 and, as such, the other of the source and drain electrodes SE and DE (for example, the drain electrode DE), which is not connected to the data line DL, is partially exposed through the contact hole CT.

The pixel electrode PE is formed on the interlayer insulating film 103, and is connected to the thin film transistor TFT (for example, the drain electrode DE of the thin film transistor TFT) via the contact hole CT.

In the TFT array substrate 100 according to the illustrated embodiment of the present invention, as described above, the data line is formed in the form of a multilayer structure including the second metal layer L2 made of copper (Cu) and, as such, exhibits resistance reduced to resistance of copper (Cu). Accordingly, the power consumption of the TFT array substrate 100 is reduced and, as such, is more favorable to enlargement of display devices.

In addition, although the source and drain electrodes SE and DE are formed on the same layer as the data line DL, namely, are formed on the gate insulating film 102, they have a structure, which does not include the second metal layer L2 made of copper (Cu). In this case, it may be possible to prevent copper (Cu) ions from being introduced into a channel area CA of the active layer ACT, which is exposed during formation of the source and drain electrodes SE and DE. This will be described in more detail later.

Hereinafter, a method for manufacturing the TFT array substrate according to the illustrated embodiment of the present invention will be described with reference to FIGS. 5 and 6, FIGS. 7A to 7C, FIGS. 8A to 8F, and FIGS. 9A to 9C.

Figure 5:
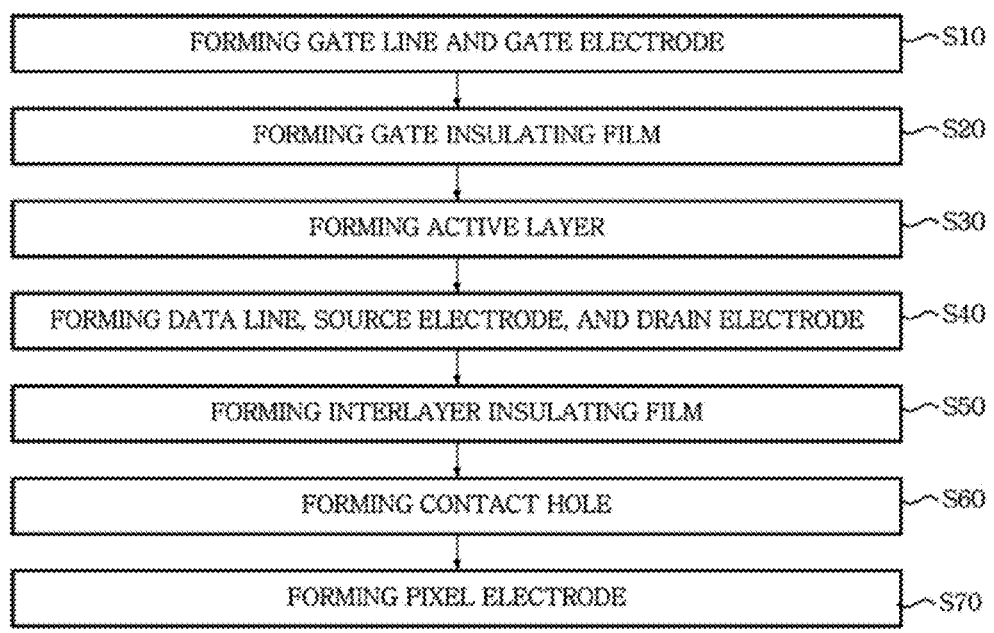
FIG. 5 is a flowchart illustrating an example method for manufacturing the TFT array substrate according to the illustrated embodiment of the present invention.
Figure 6:
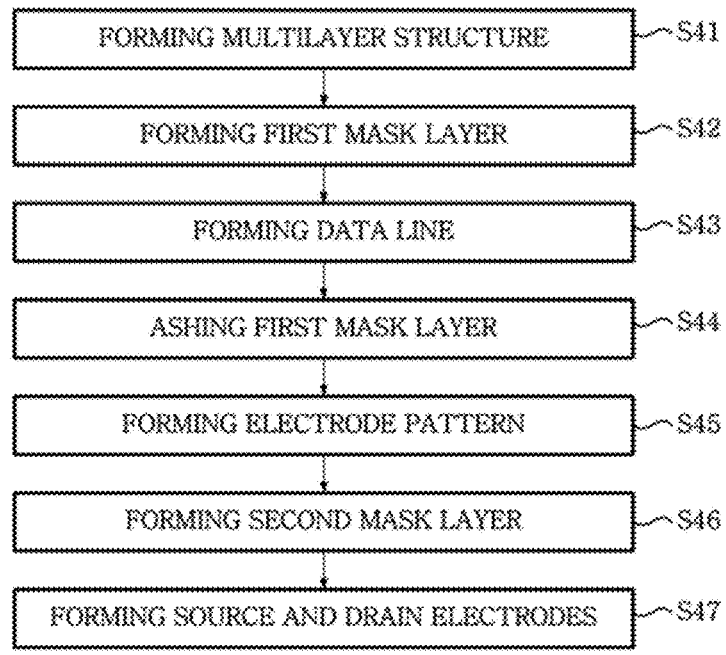
FIG. 6 is a flowchart illustrating a process for forming a data line, a source electrode and a drain electrode in the method of FIG. 5.

FIG. 5 is a flowchart illustrating an example method for manufacturing the TFT array substrate according to the illustrated embodiment of the present invention. FIG. 6 is a flowchart illustrating a process for forming the data line, source electrode and drain electrode in the method of FIG. 5. FIGS. 7A to 7C, FIGS. 8A to 8G, and FIGS. 9A to 9C are schematic views illustrating processes of FIGS. 5 and 6, respectively.

As illustrated in FIG. 5, the method for manufacturing the TFT array substrate according to the illustrated embodiment of the present invention includes processes of forming the gate line GL and gate electrode GE on the substrate 101 (S10), forming the gate insulating film 102 over the substrate 101, to cover the gate line GL and gate electrode GE (S20), forming the active layer ACT on the gate insulating film 102, to overlap with at least a portion of the gate electrode GE (S30), forming the data line DL, source electrode SE, and drain electrode DE on the gate insulating film 102 (S40), forming the interlayer insulating film 103 over the gate insulating film 102, to cover the data line DL, source electrode SE, and drain electrode DE (S50), patterning the interlayer insulating film 103, thereby forming a contact hole CT to expose at least a portion of one of the source and drain electrodes SE and DE (S60), and forming the pixel electrode PE on the interlayer insulating film 103 (S70).

As illustrated in FIG. 6, the process S40 of forming the data line DL, source electrode SE, and drain electrode DE includes forming, over the gate insulating film 102, a multilayer structure L1-L2 including at least one first metal layer L1 to cover the active layer ACT, and a second metal layer formed over the first metal layer L1 while being made of copper (Cu) (S41), forming a first mask layer on the multilayer structure L1-L2 (S42), patterning the multilayer structure L1-L2 under the condition that the first mask layer has been formed, thereby forming the data line DL, which has a multilayer structure (S43), asking the first mask layer (S44), patterning the second metal layer L2 under the condition that the first mask layer has been asked, thereby forming an electrode pattern including the at least one first metal layer L1 (S45), forming a second mask layer on the gate insulating film 102, to cover the electrode pattern, except for a portion of the electrode pattern corresponding to the channel area CA of the active layer ACT, and the data line (S46), and patterning the at least one first metal layer L1 under the condition that the second mask layer has been formed, thereby forming the source and drain electrodes SE and DE including the at least one first metal layer L1 (S47).

Figure 7A:
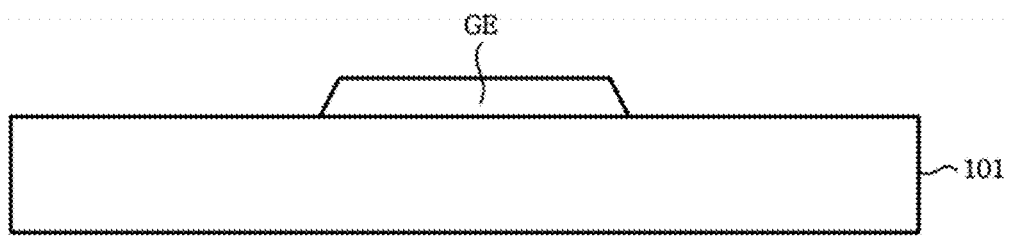
FIGS. 7A to 7C, FIGS. 8A to 8G, and FIGS. 9A to 9C are schematic views illustrating processes of FIGS. 5 and 6, respectively.

As illustrated in FIG. 7A, the gate line GL (FIGS. 2 and 3) and gate electrode GE are formed on the substrate 101 (S10).

The gate line GL is formed to extend in one direction while substantially corresponding to a display area, on which an image is displayed.

As illustrated in FIG. 3, the gate electrode GE is formed to be branched from the gate line GL while corresponding to the corresponding pixel area PA.

Figure 7B:
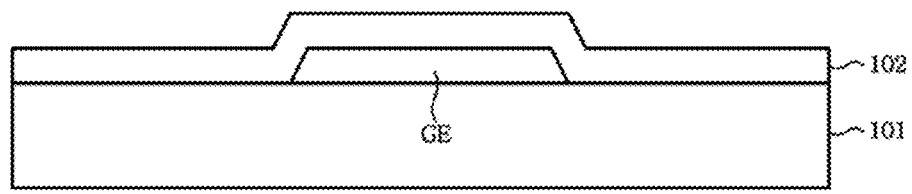

As illustrated in FIG. 7B, an insulating material is then laminated over the substrate 101, to form the gate insulating film 102 to cover the gate line GL and gate electrode GE.

Figure 7C:
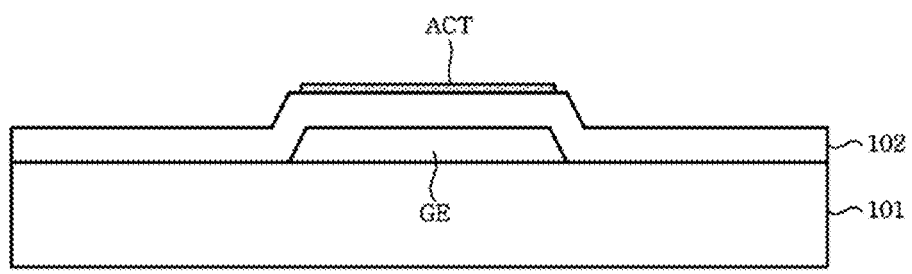

As illustrated in FIG. 7C, oxide semiconductor formed over the gate insulating film 102 is then patterned, to form the active layer ACT, which overlaps with at least a portion of the gate electrode GE.

In this case, the oxide semiconductor is $A_xB_yC_zO$ (x, y, z≥0). Here, A, B, and C are selected from Zn, Cd, Ga, In, Sn, Hf, Al, and Zr. For example, the oxide semiconductor may be one of In—Zn oxide (IZO), In—Ga—Zn oxide (IGZO), In—Sn—Zn oxide (ITZO), and In—Al—Zn oxide (IAZO).

Figure 8A:
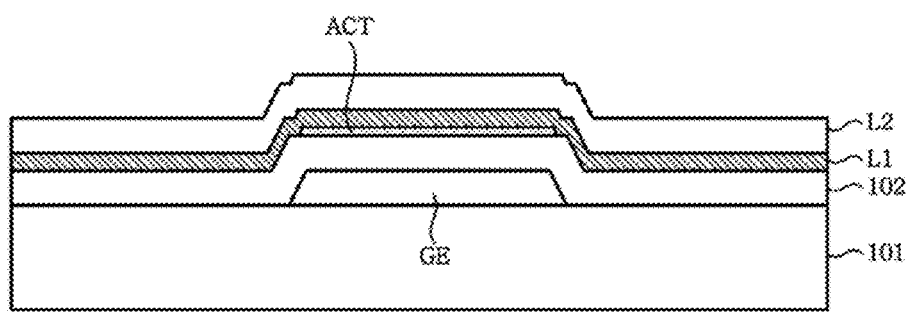

As illustrated in FIG. 8A, the multilayer structure is subsequently formed over the gate insulating film 102 (S41). The multilayer structure includes the at least one first metal layer L1 to cover the active layer ACT, and the second metal layer L2 formed over the first metal layer L1 while being made of copper (Cu).

In this case, the at least one first metal layer L1 is made of one of molybdenum-titanium (MoTi), molybdenum (Mo), titanium (Ti), and chromium (Cr).

Figure 8B:
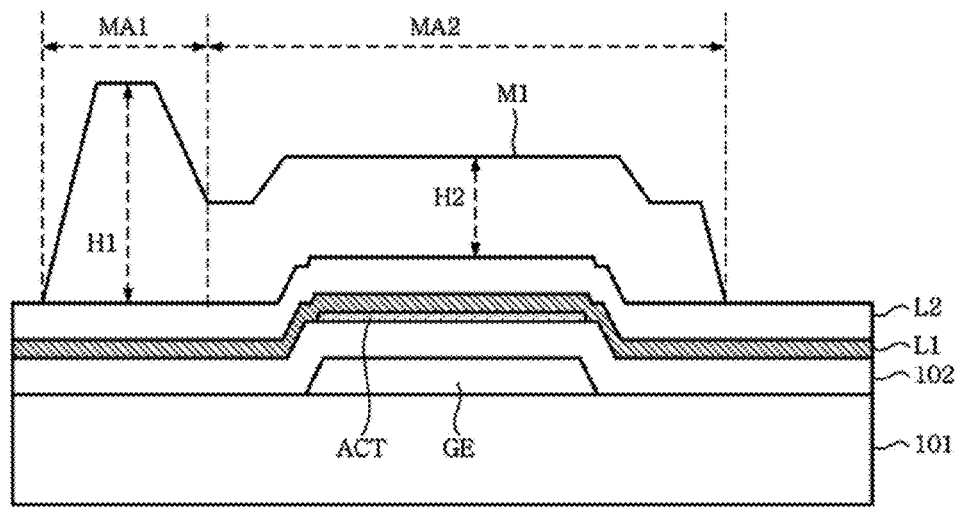

As illustrated in FIG. 8B, the first mask layer M1 is then formed over the multilayer structure L1-L2 (S42).

The first mask layer M1 includes a first mask area MA1 corresponding to the data line DL while having a height H1, and a second mask area MA2 corresponding to at least the electrode pattern overlapping with the active layer ACT while having a second height H2 lower than the first height H1. In this case, the multilayer structure L1-L2 is exposed without being covered by the first mask layer M1 in an area other than areas corresponding to the first and second mask areas MA1 and MA2.

Figure 8C:
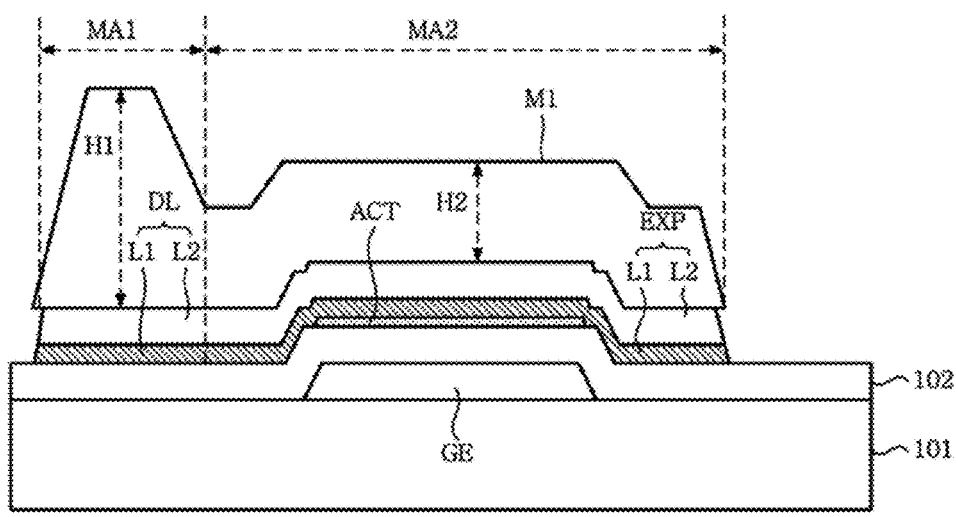

As illustrated in FIG. 8C, the multilayer structure L1-L2 is subsequently patterned under the condition that the first mask layer M1 has been formed, to form the data line DL, which has the multilayer structure L1-L2 (S43).

That is, the data line DL, which has the multilayer structure L1-L2, is formed to correspond to the first mask area MA1. In addition, an electrode pattern EXP, which has the multilayer structure L1-L2, is formed to correspond to the second mask area MA2.

Figure 8D:
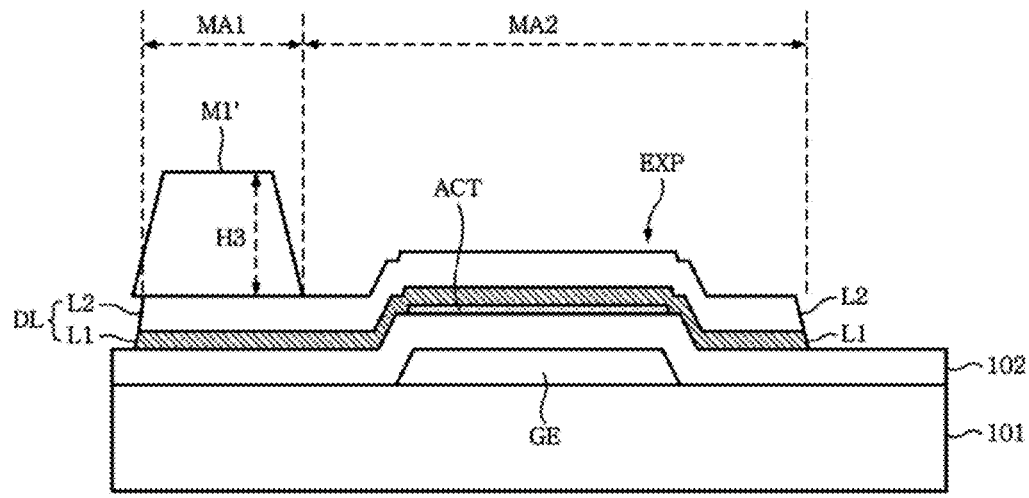

As illustrated in FIG. 8D, the first mask layer M1 is then ashed (S44).

In the ashed first mask layer, M1', the second metal layer L2 of the multilayer structure L1-L2 is exposed through removal of the second mask area MA2 from the first mask layer M1, and the first mask area M1 has a third height H3 lower than the first height H1.

Figure 8E:
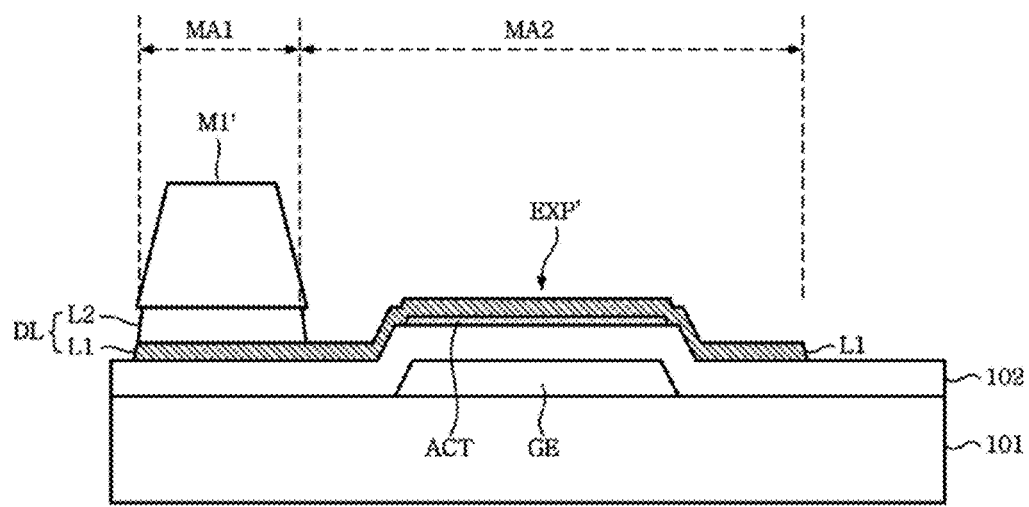

As illustrated in FIG. 8E, the second metal layer L2 is subsequently patterned under the condition that the ashed first mask layer has been formed to include the first mask area MA1 having the third height H3, to form an electrode pattern EXP' only including the at least one first metal layer L1 (S45).

Thereafter, the ashed first mask M1' is removed.

Figure 8F:
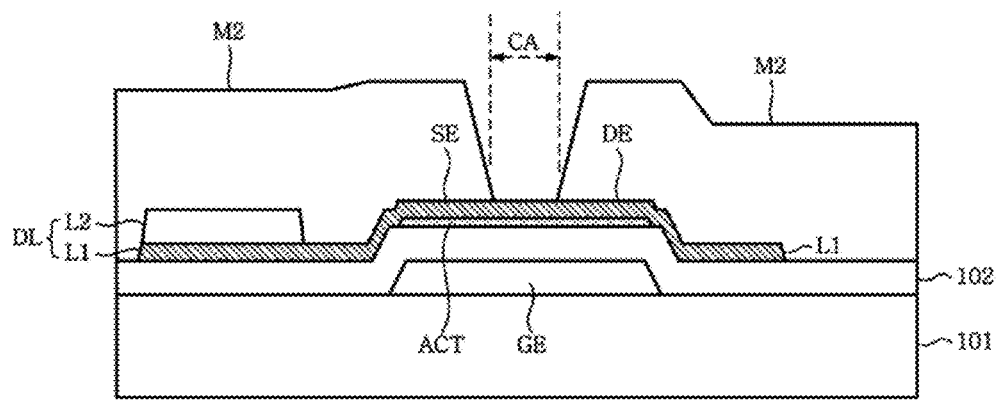

Subsequently, as illustrated in FIG. 8F, the second mask layer M2 is formed on the gate insulating film 102 (S46).

The second mask layer M2 allows the electrode pattern EXP' only including the at least one first metal layer L1 to be exposed at a portion thereof corresponding to the channel area CA of the active layer ACT. That is, the second mask layer M2 is formed on the gate insulating film 102, to cover the electrode pattern EXP', except for the portion of the electrode pattern EXP' corresponding to the channel area CA of the active layer ACT. Accordingly, the data line DL, which has the multilayer structure including the first and second metal layers L1 and L2, is covered by the second mask layer M2.

Figure 8G:
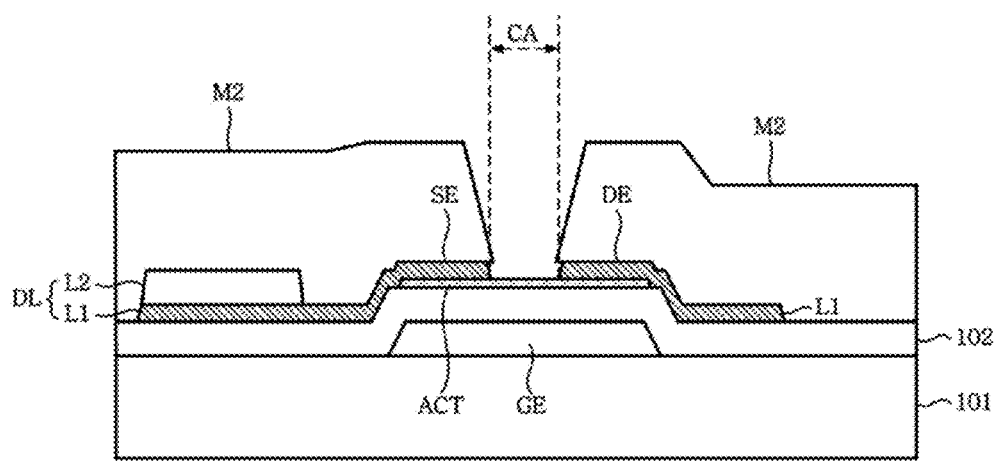

As illustrated in FIG. 8G, the at least one first metal layer L1 is then patterned under the condition that the second mask layer M2 has been formed, to form the source and drain electrodes SE and DE, which are spaced from each other at opposite sides of the channel area CA of the active layer ACT (S47).

During formation of the source and drain electrodes SE and DE (S47), the channel area CA of the active layer ACT is in an exposed state. As described above, however, copper (Cu) ions are not introduced into the channel area CA of the active layer ACT because the data line DL having the multilayer structure including the first and second metal layers L1 and L2 is in a state of being covered by the second mask layer M2.

That is, although the data line DL is formed to have a multilayer structure including a copper (Cu) layer, it may be possible to prevent copper (Cu) ions from being introduced into the channel area CA of the active layer ACT because formation of the data line DL (S43) and formation of the source and drain electrodes SE and DE (S47) are executed, using different masks.

Accordingly, it may be possible to prevent degradation of semiconductor characteristics of the active layer ACT caused by introduction of copper (Cu) ions into the channel area CA of the active layer ACT and degradation of reliability of the thin film transistor in terms of device characteristics. Thus, reliability of the TFT array substrate 100 may be enhanced.

Figure 9A:
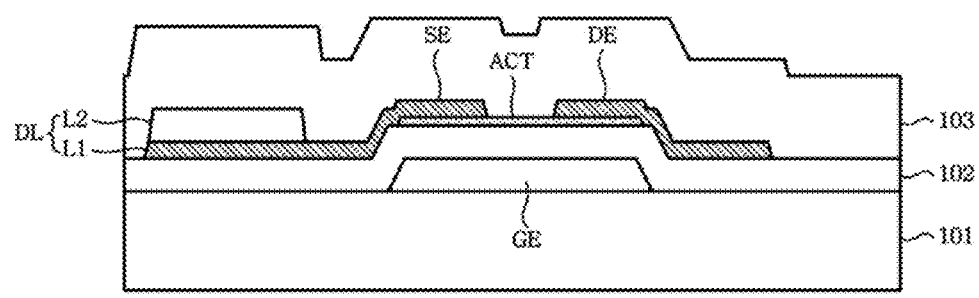

Thereafter, as illustrated in FIG. 9A, the second mask layer M2 is removed. An insulating material is then laminated over the gate insulating film 102, to form the interlayer insulating film 103, which covers the data line DL, source electrode SE, and drain electrode DE (S50).

Figure 9B:
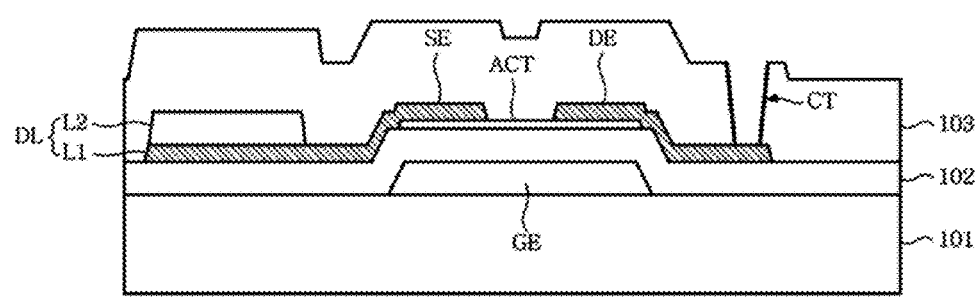

As illustrated in FIG. 9B, the interlayer insulating film 103 is then patterned, thereby forming the contact hole CT to expose at least a portion of one of the source and drain electrodes SE and DE (for example, the drain electrode DE), which is not connected to the data line DL (S60).

Figure 9C:
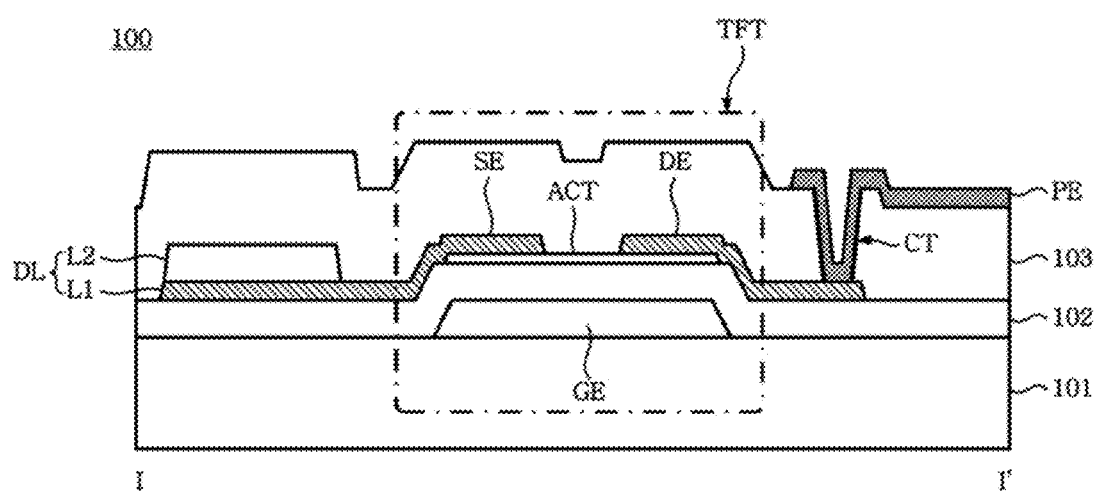

As illustrated in FIG. 9C, a conductive film formed over the interlayer insulating film 103 is patterned, thereby forming the pixel electrode PE connected to one of the source and drain electrodes SE and DE (for example, the drain electrode DE), at least a portion of which is exposed through the contact hole CT (S70).

As apparent from the above description, the method for manufacturing the TFT array substrate according to the illustrated embodiment of the present invention includes patterning a multilayer structure including at least one first metal layer and a second metal layer made of copper, thereby forming data lines, and forming source and drain electrodes constituted by the at least one first metal layer under the condition that a mask layer covering the data lines has been formed.

That is, the data lines are constituted by the multilayer structure including the at least one first metal layer and the second metal layer made of copper and, as such, it may be possible to reduce resistance of the data lines. Thus, it may be possible to reduce power consumption of the TFT array substrate.

It will be apparent to those skilled in the art that various modifications and variations can be made in the present invention without departing from the spirit or scope of the inventions. Thus, it is intended that the present invention cover the modifications and variations of this invention provided they come within the scope of the appended claims and their equivalents.

What is claimed is:

1. A method for manufacturing a thin film transistor array substrate including gate and data lines intersecting with each other to define a plurality of pixel areas, comprising:
   forming, on the substrate, the gate lines and gate electrodes respectively branched from corresponding ones of the gate lines to the pixel areas;
   forming, over the substrate, a gate insulating film to cover the gate lines and the gate electrodes;
   forming, on the gate insulating film, active layers to overlap with the gate electrodes, respectively;
   forming, over the gate insulating film, a multilayer structure including at least one first metal layer and a second metal layer made of copper (Cu);
   forming, on the multilayer structure, a first mask layer including first mask areas having a first height and second mask areas having a second height which is lower than the first height, the first mask areas respectively corresponding to the data lines, the second mask areas respectively corresponding to electrode patterns, each electrode pattern corresponding to a source electrode, a drain electrode, and a channel area of the active layer, and the channel area of the active layer corresponding to a space between the source electrode and the drain electrode;
   patterning the multilayer structure under condition that the first mask layer has been formed, thereby forming the data lines constituted by the multilayer structure;
   ashing the first mask layer such that the first mask areas have a third height lower than the first height and the second mask areas are removed;
   patterning the second metal layer under condition that the first mask areas having the third height have been formed, thereby forming the electrode patterns constituted by the at least one first metal layer but not by the second metal layer made of copper;
   removing the first mask areas having the third height;
   forming, on the gate insulating film, a second mask layer to expose portions of the electrode patterns respectively corresponding to the channel areas of the active layers; and
   patterning the electrode patterns constituted by the at least one first metal layer under condition that the second mask layer has been formed, thereby forming the source and drain electrodes spaced from each other at opposite sides of each channel area of corresponding ones of the active layers.

2. The method according to claim 1, further comprising:
   removing the second mask layer;
   forming, over the gate insulating film, an interlayer insulating film to cover the data lines and the source and drain electrodes;
   patterning the interlayer insulating film, thereby forming contact holes each exposing at least a portion of one of the source and drain electrodes corresponding to the contact hole; and
   forming, on the interlayer insulating film, pixel electrodes each connected to one of the source and drain electrodes corresponding to the pixel electrode via the contact hole corresponding to the pixel electrode.

3. The method according to claim 1, wherein the at least one first metal layer of the multilayer structure is made of one of molybdenum-titanium (MoTi), molybdenum (Mo), titanium (Ti), and chromium (Cr).

4. The method according to claim 1, wherein:
the active layer is made of oxide semiconductor; and
the oxide semiconductor is $A_xB_yC_zO$ (x, y, z≥0), where A, B, and C are selected from Zn, Cd, Ga, In, Sn, Hf, Al, and Zr.

5. The method according to claim 1, wherein:
the active layer is made of oxide semiconductor; and
the oxide semiconductor is one of In—Zn oxide (IZO), In—Ga—Zn oxide (IGZO), In—Sn—Zn oxide (ITZO), and In—Al—Zn oxide (IAZO).

6. The method according to claim 1, wherein the electrode patterns include only the at least one first metal layer and have no copper.

* * * * *